US012563988B2

(12) United States Patent
Minoura et al.

(10) Patent No.: US 12,563,988 B2
(45) Date of Patent: Feb. 24, 2026

(54) SUBSTRATE PROCESSING METHOD AND SUBSTRATE PROCESSING APPARATUS

(71) Applicant: TOKYO ELECTRON LIMITED, Tokyo (JP)

(72) Inventors: Yuya Minoura, Miyagi (JP); Takashi Enomoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 172 days.

(21) Appl. No.: 18/213,700

(22) Filed: Jun. 23, 2023

(65) Prior Publication Data

US 2023/0335409 A1      Oct. 19, 2023

Related U.S. Application Data

(63) Continuation of application No. PCT/JP2021/047372, filed on Dec. 21, 2021.

(30) Foreign Application Priority Data

Dec. 24, 2020      (JP) ................................. 2020-215422

(51) Int. Cl.
*H01L 21/311*      (2006.01)
*H01L 21/02*       (2006.01)

(52) U.S. Cl.
CPC .... *H01L 21/31116* (2013.01); *H01L 21/0206* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 6,265,309 B1* | 7/2001 | Gotoh | ............... | H01L 21/02063 |
| | | | | 510/420 |
| 2016/0351406 A1* | 12/2016 | Sawataishi | .............. | H01J 37/00 |
| 2019/0131140 A1 | 5/2019 | Sun et al. | | |
| 2020/0105508 A1* | 4/2020 | Belau | ................ | H01L 21/67253 |
| 2020/0234963 A1* | 7/2020 | Kumakura | .......... | H01L 21/3065 |

FOREIGN PATENT DOCUMENTS

| | | | |
|---|---|---|---|
| JP | H11-323394 A | 11/1999 |
| JP | 2014-090022 A | 5/2014 |
| JP | 2016-207840 A | 12/2016 |
| JP | 2016-225436 A | 12/2016 |
| JP | 2020-115498 A | 7/2020 |
| WO | 2011/052354 A1 | 5/2011 |

OTHER PUBLICATIONS

International Search Report for International Application No. PCT/JP2021/047372; issued on Feb. 8, 2022 with English Translation. (6 pp).

* cited by examiner

*Primary Examiner* — Roberts P Culbert
(74) *Attorney, Agent, or Firm* — XSENSUS LLP

(57) ABSTRACT

A substrate processing method includes providing a substrate formed with a stacked film including at least an etching target film, an underlying layer disposed below the etching target film, and a mask disposed above the etching target film; etching the etching target film through the mask using plasma; and performing heat treatment on the substrate at a predetermined temperature after the etching. At least one of the mask and the underlying layer contains a transition metal.

20 Claims, 11 Drawing Sheets

| WAFER TEMPERATURE (deg.C) | PLASMA ASHING | | | | RADICAL ASHING | | | | |
|---|---|---|---|---|---|---|---|---|---|
| | -20 | 30 | 50 | 60 | 60 | 90 | 115 | 137 | 250 |
| W RESIDUE | ABSENT | ABSENT | ABSENT | ABSENT | ABSENT | ABSENT | ABSENT | PRESENT | PRESENT |
| AFS RESIDUE | PRESENT | PRESENT | PRESENT | ABSENT | ABSENT | ABSENT | ABSENT | ABSENT | ABSENT |
| CF POLYMER RESIDUE | ABSENT | ABSENT | ABSENT | ABSENT | PRESENT | ABSENT | ABSENT | ABSENT | ABSENT |

FIG. 11

SUBSTRATE PROCESSING METHOD AND SUBSTRATE PROCESSING APPARATUS

CROSS-REFERENCE TO RELATED APPLICATIONS

This application is a Continuation of International Application No. PCT/JP2021/047372, filed on Dec. 21, 2021, which claims priority from Japanese Patent Application No. 2020-215422, filed on Dec. 24, 2020, all of which are incorporated herein in their entirety by reference.

TECHNICAL FIELD

The present disclosure relates to a substrate processing method and a substrate processing apparatus.

BACKGROUND

An etching technique in a low-temperature environment has been known in which a hole with a high aspect ratio is formed in a semiconductor wafer with stacked layers of silicon oxide and silicon nitride (see, e.g., Japanese Patent Laid-Open Publication No. 2016-207840). The use of a hydrogen-containing gas to etch an etching target film containing silicon nitride may result in a reaction product that is prone to depositing on the surface and side walls of the etching target film after the etching processing.

SUMMARY

According to one aspect of the present disclosure, a substrate processing method includes providing a substrate formed with a stacked film including at least an etching target film, an underlying layer disposed below the etching target film, and a mask disposed above the etching target film; etching the etching target film through the mask using plasma; and performing heat treatment on the substrate at a predetermined temperature after the etching. At least one of the mask and the underlying layer contains a transition metal.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 11 is a table illustrating the state of tungsten-containing residue, ammonium fluorosilicate residue, and CF polymer residue as a function of substrate temperature according to an embodiment.

DETAILED DESCRIPTION

Figure 1:
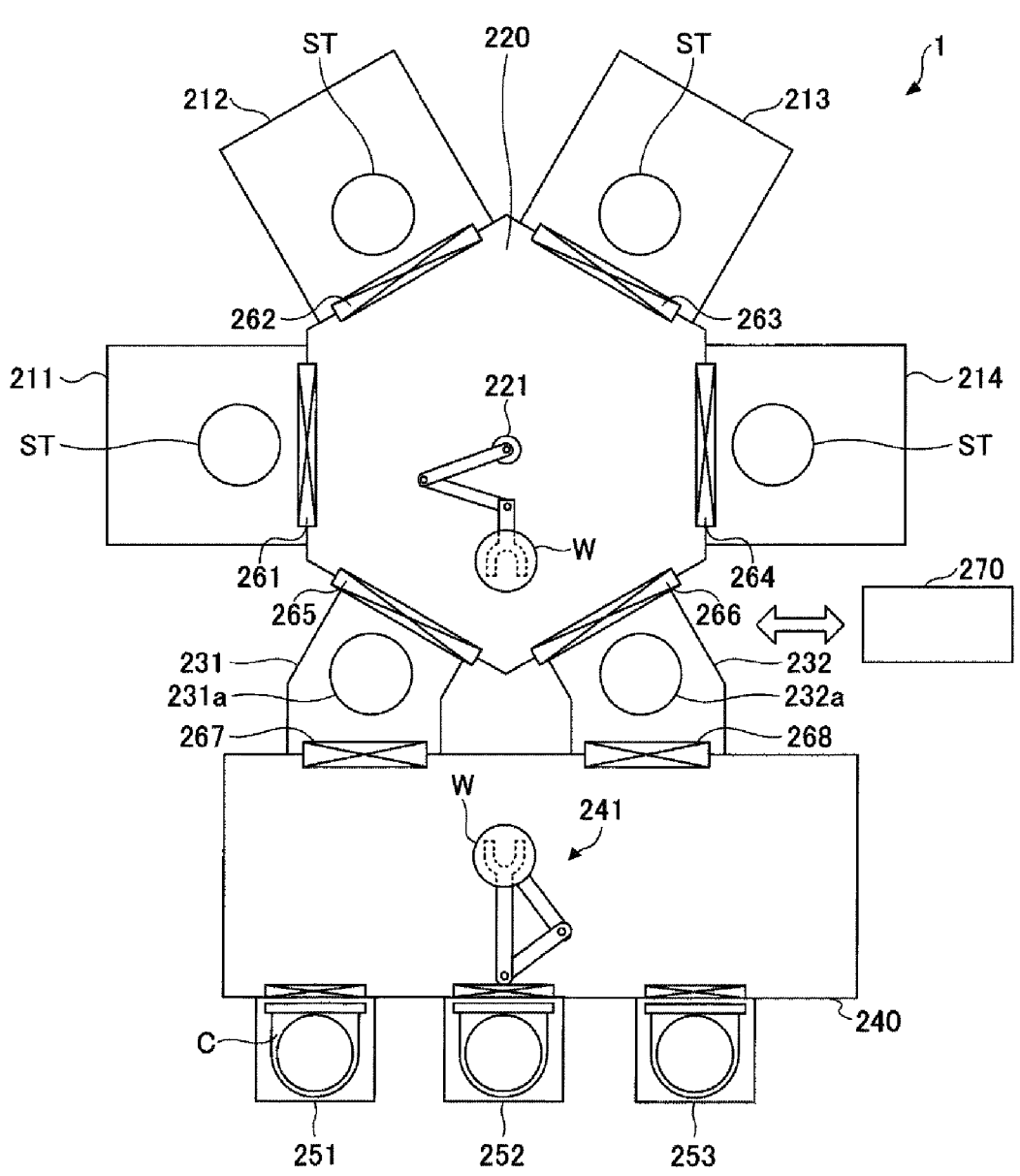
FIG. 1 is a diagram illustrating an exemplary substrate processing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Embodiments for carrying out the present disclosure are described below with reference to the drawings. The same reference numerals are used to indicate the same components across all drawings, and repetitive descriptions may be omitted for brevity.

<Substrate Processing System>

An exemplary substrate processing system 1 according to an embodiment is now described with reference to FIG. 1. FIG. 1 illustrates an example of the substrate processing system 1 according to an embodiment. The substrate processing system 1 carries out a substrate processing method, which involves etching and heat treatment processes according to an embodiment. However, this example is not intended to limit the scope of the present disclosure. The substrate processing system 1 according to the present embodiment may perform an ashing process and the etching process, or alternatively, the substrate processing method that involves etching, heat treatment, and ashing processes may be implemented.

The substrate processing system 1 includes processing chambers 211 to 214, a vacuum transfer chamber 220, load lock chambers 231 and 232, an atmospheric transfer chamber 240, load ports 251 to 253, gate valves 261 to 268, and a controller 270.

The processing chamber 211 has a stage ST on which a substrate W is placed and is connected to the vacuum transfer chamber 220 via the gate valve 261. Similarly, the processing chamber 212 has a stage ST on which a substrate is placed and is connected to the vacuum transfer chamber 220 via the gate valve 262. The processing chamber 213 has a stage ST on which a substrate is placed and is connected to the vacuum transfer chamber 220 via the gate valve 263. The processing chamber 214 has a stage ST on which a substrate is placed and is connected to the vacuum transfer chamber 220 via the gate valve 264. The interiors of the processing chambers 211 to 214 are depressurized to a predetermined vacuum atmosphere, and the substrate is subjected to a desired processing (such as etching, heat treatment, and ashing) therein. The controller 270 controls the operation of each component responsible for processing inside the processing chambers 211 to 214.

The vacuum transfer chamber 220 is decompressed to a predetermined vacuum atmosphere inside. Furthermore, the vacuum transfer chamber 220 is provided with a transfer mechanism 221. The transfer mechanism 221 facilitates the loading and unloading of a substrate to and from the processing chambers 211 to 214 and the load lock chambers 231 and 232. The operation of the transfer mechanism 221 is controlled by the controller 270.

The load lock chamber 231 has a stage 231a on which a substrate is placed, is connected to the vacuum transfer chamber 220 via the gate valve 265, and is also connected to the atmospheric transfer chamber 240 via the gate valve 267. Similarly, the load lock chamber 232 has a stage 232a on which a substrate is placed, is connected to the vacuum transfer chamber 220 via the gate valve 266, and is also connected to the atmosphere transfer chamber 240 via the gate valve 268. The interior of the load lock chambers 231 and 232 may be switched between atmospheric and vacuum environments. The switching between atmospheric and vacuum environments in the load lock chambers 231 and 232 is controlled by the controller 270.

The interior of the atmospheric transfer chamber 240 has an atmospheric environment, and for instance, a downward flow of clean air is formed. In addition, the atmospheric transfer chamber 240 is provided with a transfer mechanism 241 that facilitates the loading and unloading of a substrate to and from the load lock chambers 231 and 232, as well as carriers C of the load ports 251 to 253, which will be described later. The operation of the transfer mechanism 241 is controlled by the controller 270.

The load ports 251 to 253 are provided on the wall of the long sides of the atmospheric transfer chamber 240. The load ports 251 to 253 are attached with their own carriers C in which a substrate is accommodated or empty carriers C. Example of the carrier C includes a front opening unified pod (FOUP) or other types of wafer carriers.

The gate valves 261 to 268 are configured to be openable and closable. The opening and closing of the gate valves 261 to 268 are controlled by a controller 270.

The controller 270 manages the operation of the processing chambers 211 to 214, the operation of the transfer mechanisms 221 and 241, the opening and closing of the gate valves 261 to 268, and the switching between vacuum and atmospheric environments within the load lock chambers 231 and 232, thereby controlling the entire operation of the substrate processing system 1.

The following describes an exemplary operation of the substrate processing system 1. In one example, the controller 270 opens the gate valve 267 and activates the transfer mechanism 241 to transfer a substrate from the carrier C of the load port 251 to the stage 231a of the load lock chamber 231. Then, the controller 270 closes the gate valve 267 to set the inside of the load lock chamber 231 to a vacuum environment.

The controller 270 opens the gate valves 261 and 265 and activates the transfer mechanism 221 to transfer a substrate from the load lock chamber 231 to the stage ST of the processing chamber 211. Then, the controller 270 closes the gate valves 261 and 265 and activates the processing chamber 211 to execute predetermined processing (e.g., such as etching processing) on the substrate.

Subsequently, the controller 270 opens the gate valves 261 and 263 and activates the transfer mechanism 221 to transfer the substrate that has been processed in the processing chamber 211 to the stage ST of the processing chamber 213. The controller 270 then closes the gate valves 261 and 263 and activates the processing chamber 213 to execute the predetermined processing (e.g., such as heat treatment to be described later) on the substrate.

The controller 270 may transfer the substrates that have been processed in the processing chambers 211 and 212 to the stages ST in the processing chambers 213 and 214. In the present embodiment, the substrates that have been processed in the processing chambers 211 and 212 may be transferred to either the processing chamber 213 or the processing chamber 214, depending on the operating status of the processing chambers 213 and 214 for the ashing processing. The controller 270 may use the processing chambers 213 and 214 to perform predetermined processing operations (e.g., etching processing or heat treatment) on a plurality of substrates in parallel, improving productivity.

The controller 270 controls the transfer mechanism 221 to transfer the substrate subjected to heat treatment (or the substrate subjected to ashing) after etching processing to either the stage 231a of the load-lock chamber 231 or the stage 232a of the load-lock chamber 232. The controller 270 sets the inside of the load lock chamber 231 or the load lock chamber 232 to an atmospheric environment. The controller 270 opens either the gate valve 267 or the gate valve 268 and controls the transfer mechanism 241 to transfer the substrate in the load lock chamber 232 to the carrier C of an appropriate load port (e.g., the load port 253) for accommodation.

As described above, the substrate processing system 1 illustrated in FIG. 1 may perform etching processing, heat treatment, ashing processing, or similar processes on the substrate without being exposed to the atmosphere, which means that the substrate may be processed within the processing chamber without compromising the vacuum.

<Substrate Processing Apparatus>

Figure 2:
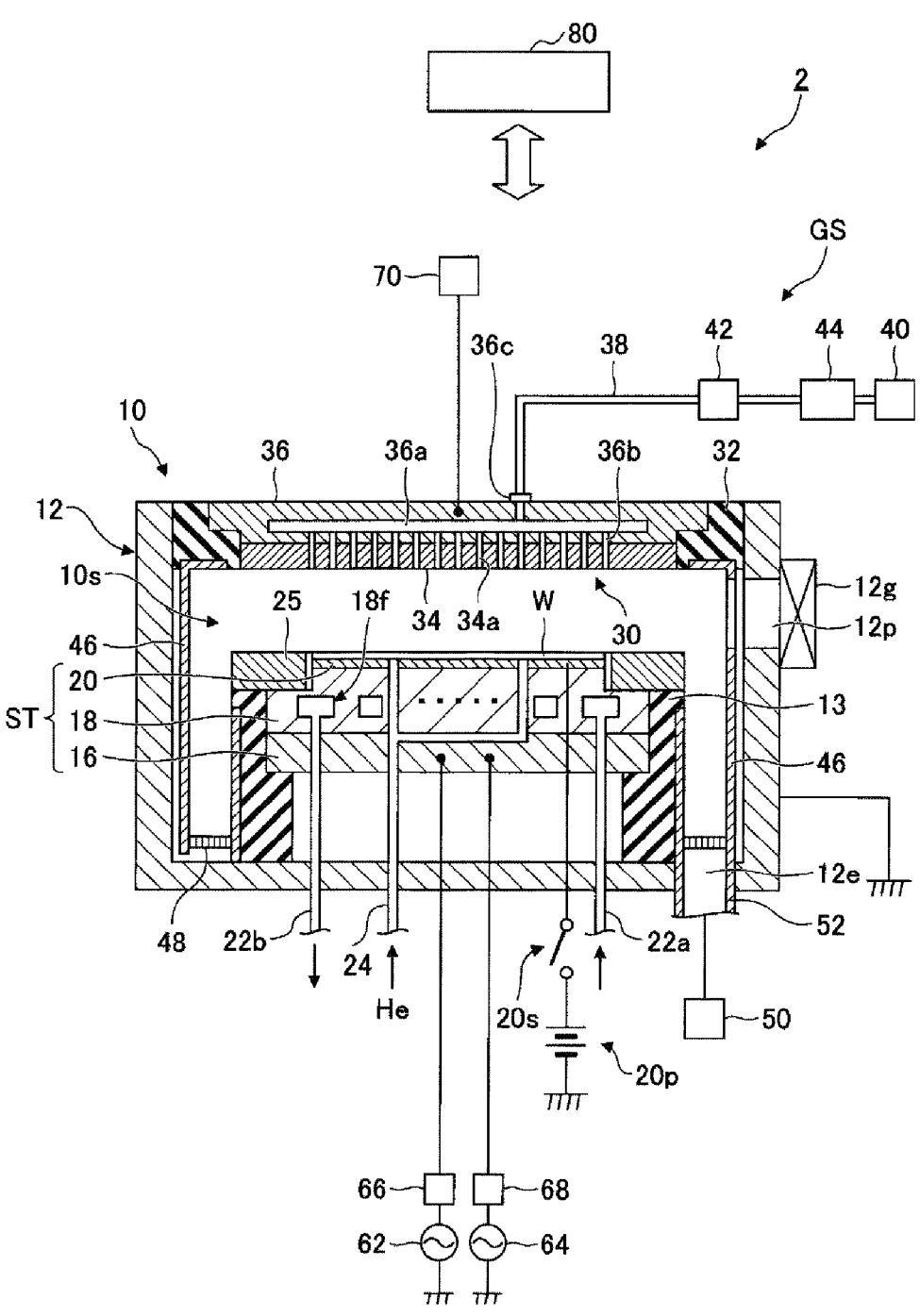
FIG. 2 is a diagram illustrating an exemplary substrate processing apparatus (for etching and plasma ashing) according to an embodiment.
Figure 3:
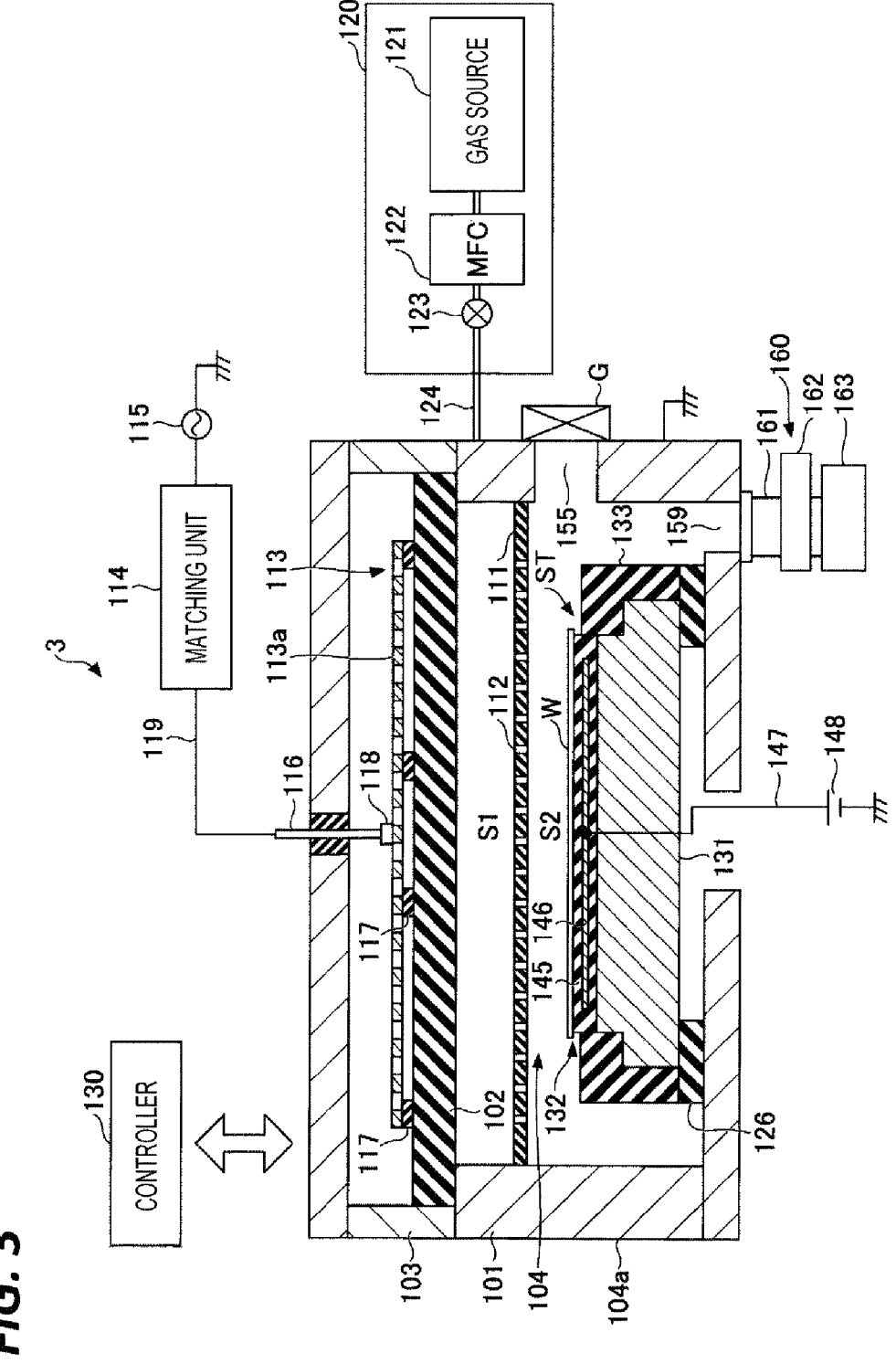
FIG. 3 is a diagram illustrating an exemplary substrate processing apparatus (for radical ashing) according to an embodiment.

The following describes a substrate processing apparatus that may implement at least one of the processing chambers 211 to 214 with reference to FIGS. 2 and 3. FIGS. 2 and 3 are diagrams illustrating exemplary substrate processing apparatuses according to an embodiment. The substrate processing apparatus 2 illustrated in FIG. 2 performs an etching process using plasma and/or an ashing process using plasma on a substrate W. The substrate processing apparatus 3 illustrated in FIG. 3 performs a baking process or an ashing process using radicals on the substrate W.

In the etching process, a reaction product that includes silicon (Si), nitrogen (N), and fluorine (F) is produced and deposited onto an etching target film. An example of such a reaction product that includes silicon (Si), nitrogen (N), and fluorine (F) includes ammonium fluorosilicate. In the baking process, thermal energy for heating the substrate W is used to sublimate and remove the reaction product that includes silicon (Si), nitrogen (N), and fluorine (F). The reaction product that includes silicon (Si), nitrogen (N), and fluorine (F) is an example of a second reaction product defined herein. The baking process is one example of the heat treatment process performed on the substrate W.

The second reaction product includes a reaction product that includes nitrogen (N), hydrogen (H), and halogen, which is generated during the etching processing and deposited on the etching target film. An example of such a reaction product that includes nitrogen (N), hydrogen (H), and halogen includes an ammonium halide. The second reaction product may include at least one of ammonium, ammonium chloride, ammonium bromide, or ammonium iodide.

In the ashing using plasma (hereinafter also referred to as "plasma ashing") process, radicals are introduced to the plasma, and ion irradiation energy generated in the plasma is used to remove a mask made of an organic film. In the plasma ashing process, a reaction product that includes carbon (C) and fluorine (F) generated in the etching process is also removed. Such a reaction product that includes carbon (C) and fluorine (F), such as carbon fluoride (CF) polymer, generated in the etching process is one example of a third reaction product defined herein.

In the ashing using radicals (hereinafter also referred to as "radical ashing") process, the organic film mask is removed by introducing radicals and applying thermal energy to the substrate W, without the use of ions generated from plasma. The radical ashing process is also effective in removing the reaction product that includes carbon (C) and fluorine (F) generated in the etching process.

The ashing rates in the plasma ashing process and the radical ashing process are different. The plasma ashing process employs radicals and ions to perform ashing, resulting in a higher ashing rate than the radical ashing process where only radicals are used to perform ashing. Additionally, the temperature zones to be controlled in the plasma ashing process and the radical ashing process are different. Both the radical ashing and plasma ashing processes control the temperature of the substrate W, making them one example of the heat treatment process on the substrate W.

<Substrate Processing Apparatus 2>

The substrate processing apparatus 2, capable of executing the plasma ashing process, is described first below with reference to FIG. 2. The substrate processing apparatus 2 may perform the etching (specifically, plasma etching) process, followed by the plasma ashing process.

The substrate processing apparatus 2 includes a processing container 10 provided with a processing chamber 10s therein. The processing container 10 includes a main body 12 with a substantially cylindrical shape, which may be made of materials such as aluminum. The inner wall surface of the main body 12 is coated with a corrosion-resistant film, which is typically an anodized oxide film made of ceramics such as alumina (aluminum oxide) and yttrium oxide.

The main body 12 has a passage 12p formed in its side wall. The substrate W passes through the passage 12p upon the transfer between the processing chamber 10s and the outside of the processing container 10. The passage 12p may be opened or closed by a gate valve 12g, which is provided along the side wall of the main body 12.

The main body 12 has a support portion 13 on its bottom. The support portion 13 is made of insulating materials. The support portion 13 has a substantially cylindrical shape. The support portion 13 extends upwards from the bottom of the main body 12 within the processing chamber 10s. On the support portion 13, an edge ring 25 (also called a focus ring) is provided that surrounds the outer edge of the substrate. The edge ring 25 is substantially cylindrical and may be made of silicon or other similar materials.

The substrate processing apparatus 2 further includes a stage ST. The stage ST is supported by the support portion 13. The stage ST is provided within the processing chamber 10s and supports the substrate W.

The stage ST has a lower electrode 18 and an electrostatic chuck 20 according to one exemplary embodiment. The stage ST may further have an electrode plate 16. The electrode plate 16 has a substantial disk shape and is made of a conductor such as aluminum. The lower electrode 18 is provided on the electrode plate 16. The lower electrode 18 has a substantial disk shape and is made of a conductor such as aluminum. The lower electrode 18 is electrically connected to the electrode plate 16. The support portion 13 surrounds the outer peripheral surfaces of both the lower electrode 18 and the electrode plate 16.

The electrostatic chuck 20 is provided on the lower electrode 18. The electrostatic chuck 20 has an electrode connected to a direct current (DC) power supply 20p via a switch 20s. The voltage applied from the DC power supply 20p to the electrode generates an electrostatic attraction that holds the substrate W on the electrostatic chuck 20. The electrostatic chuck 20 supports the substrate W. The electrode plate 16 and the lower electrode 18 are examples of a base that supports the electrostatic chuck 20 and edge ring 25.

The lower electrode 18 includes a flow path 18f provided therein. The flow path 18f is supplied with a heat exchange medium (such as a refrigerant) via a pipe 22a from a chiller unit provided outside the processing container 10. The heat exchange medium is returned to the chiller unit via a pipe 22b after being supplied to the flow path 18f. In the substrate processing apparatus 2, the temperature of the substrate W, placed on the electrostatic chuck 20, is adjusted through heat exchange between the heat exchange medium and the lower electrode 18.

The substrate processing apparatus 2 is provided with a gas supply line 24. The gas supply line 24 supplies heat transfer gas (such as helium (He) gas) from a heat transfer gas supply mechanism to a space between the upper surface of the electrostatic chuck 20 and the lower surface of the substrate W.

The substrate processing apparatus 2 further includes an upper electrode 30, which is provided above the stage ST. The upper electrode 30 is supported above the main body 12 via a member 32. The member 32 is made of an insulating material. The upper electrode 30 and the member 32 close an opening formed in the top portion of the main body 12.

The upper electrode 30 may include a top plate 34 and a support 36. The lower surface of the top plate 34 acts as a lower surface on the side of the processing chamber 10s and defines the boundaries of the processing chamber 10s. The top plate 34 may be made of a low-resistance conductor or semiconductor that generates low Joule heat. The top plate 34 is formed with a plurality of gas discharge holes 34a. The multiple gas discharge holes 34a penetrate the top plate 34 in its plate thickness direction.

The support 36 detachably supports the top plate 34. The support 36 is made of a conductive material such as aluminum. The support 36 is provided with a gas diffusion chamber 36a inside. The support 36 is formed with a plurality of gas holes 36b. The multiple gas holes 36b extend downward from the gas diffusion chamber 36a. These gas holes 36b communicate with the corresponding multiple gas discharge holes 34a. The support 36 is formed with a gas introduction port 36c. The gas introduction port 36c is connected to the gas diffusion chamber 36a. The gas introduction port 36c is connected to a gas supply pipe 38.

The gas supply pipe 38 is connected to a gas supply section GS, which includes a gas source group 40, a flow controller group 44, and a valve group 42. The gas source group 40 is connected to the gas supply pipe 38 via the flow controller group 44 and the valve group 42. The gas source group 40 includes a plurality of gas sources. The valve group 42 includes a plurality of opening and closing valves. The flow controller group 44 includes a plurality of flow controllers, each of which is either a mass flow controller or a pressure-controlled flow controller. Each of the plurality of gas sources in the gas source group 40 is connected to the gas supply pipe 38 via the corresponding flow controller in the flow controller group 44 and the corresponding opening and closing valve in the valve group 42. The upper electrode 30 is connected to a power supply 70, which applies a voltage to the upper electrode 30. This voltage attracts positive ions in the processing chamber 10s to the top plate 34.

The substrate processing apparatus 2 has a shield 46, which is detachably provided along the inner wall surface of the main body 12. The shield 46 is also provided on the outer circumference of the support portion 13. The shield 46 is used to prevent any reaction product, such as etching by-products, from adhering to the main body 12. The shield 46 is constructed by, for example, a member made of aluminum, on the surface of which a corrosion-resistant film is coated. The corrosion-resistant film may be an oxide film such as alumina or yttrium oxide.

A baffle plate 48 is provided between the support portion 13 and the side wall of the main body 12. The baffle plate 48 is constructed by, for example, a member made of aluminum, on the surface of which a corrosion-resistant film is coated. The corrosion-resistant film may be an oxide film such as alumina or yttrium oxide. The baffle plate 48 is formed with a plurality of through holes. An exhaust port 12e is provided below the baffle plate 48 and at the bottom of the main body 12. The exhaust port 12e is connected to an exhaust device 50 via an exhaust pipe 52. The exhaust device 50 has a pressure regulating valve and a vacuum pump, such as a turbomolecular pump.

The substrate processing apparatus 2 includes a first high-frequency power supply 62 that applies a high-frequency HF power suitable for plasma generation. The first high-frequency power supply 62 generates high-frequency HF power, which ionizes gas inside the processing chamber 10, leading to plasma generation. The high-frequency HF has a frequency that falls within, for example, the range of 27 to 100 megahertz (MHz).

The first high-frequency power supply 62 is electrically connected to the lower electrode 18 via a matching unit 66. The matching unit 66 has a matching circuit that matches the impedance on the load side (i.e., the side with the lower electrode 18) of the first high-frequency power supply 62 with its output impedance. In another embodiment, the first high-frequency power supply 62 may be electrically connected to the upper electrode 30 via the matching unit 66.

The substrate processing apparatus 2 may further include a second high-frequency power supply 64 that applies a high-frequency LF power for ion attraction. The second high-frequency power supply 64 generates high-frequency LF power. The high-frequency LF has a frequency suitable for mainly attracting ions to the substrate W, for example, a frequency within the range of 400 kHz to 13.56 MHz. Alternatively, the high-frequency LF may be a pulsed voltage with a rectangular waveform.

The second high-frequency power supply 64 is electrically connected to the lower electrode 18 via a matching unit 68. The matching unit 68 has a matching circuit that matches the impedance on the load side (i.e., the side with the lower electrode 18) of the second high-frequency power supply 64 with its output impedance.

The substrate processing apparatus 2 may further include a second controller 80. The second controller 80 may be a computer equipped with a processor, a storage unit such as a memory, an input device, a display device, a signal input-output interface, or other similar components. The second controller 80 controls the components of the substrate processing apparatus 2 individually. The operator is able to use the input device to input commands used to manage the substrate processing apparatus 2 to the second controller 80. In addition, the second controller 80 enables the display device to visualize and display the operation status of the substrate processing apparatus 2. Furthermore, the storage unit of the second controller 80 stores a control program and recipe data. The control program is executed by the processor of the second controller 80, performing various types of processing in the substrate processing apparatus 2. The processor of the second controller 80 executes the control program and individually controls the components of the substrate processing apparatus 2 in accordance with the recipe data, enabling the execution of various processes, such as plasma processing methods, in the substrate processing apparatus 2.

<Substrate Processing Apparatus 3>

The following describes a substrate processing apparatus 3 capable of executing the radical ashing process with reference to FIG. 3. FIG. 3 is a diagram illustrating the exemplary substrate processing apparatus 3. The substrate processing apparatus 3 includes a processing container 101 and a controller 130. The substrate processing apparatus 3 according to the present embodiment employs inductively coupled plasma (ICP) to perform radical ashing processing on the organic film formed on the substrate W.

The substrate processing apparatus 3 includes the airtight processing container 101 with a substantially cylindrical shape, and the inner wall surface of the processing container 101 is made of materials such as anodized aluminum. The processing container 101 is grounded. The processing container 101 is vertically partitioned into upper and lower sides by an upper top plate 102. The upper side forms an antenna chamber 103 where an antenna 113 is accommodated, while the lower side forms a processing chamber 104 where plasma is generated. In the present embodiment, the upper top plate 102 is made of quartz and constitutes the ceiling wall of the processing chamber 104. The upper top plate 102 may also be made of ceramics such as aluminum oxide ($Al_2O_3$).

An ion trap 111 is provided below the upper top plate 102. The ion trap 11 is shaped like a plate and made of quartz. The ion trap 111 vertically separates the interior of the processing chamber 104 into two spaces: space S1 and space S2. The ion trap 111 prevents or reduces infiltration of ions in the plasma generated in the space S1 from entering the space S2. The ion trap 111 is formed with numerous through holes 112 that penetrate the thickness direction of the ion trap 111. Electrons and radicals included in the plasma generated in the space S1 are likely to enter the space S2 via the through holes 112.

A gas supply pipe 124 is provided on a side wall 104a of the processing chamber 104, with one end of the gas supply pipe 124 communicating with the space S1 and the other end communicating with a gas supply mechanism 120. The gas supplied from the gas supply mechanism 120 flows into the space S1 via the gas supply pipe 124. The gas supply mechanism 120 has a gas source group 121, a flow controller group 122, and a valve group 123.

The valve group 123 includes a plurality of opening and closing valves. The flow controller group 122 includes a plurality of flow controllers, each of which may be a mass flow controller (MFC) or a pressure-controlled flow controller. The gas source group 121 supplies multiple gases, including oxygen-containing gas and inert gas. The oxygen-containing gas may be, for example, $O_2$ gas, while the inert gas may be, for example, Ar or $N_2$ gas. The gas sources in the gas source group 121 are connected to the gas supply pipe 124 via the respective corresponding flow controllers of the flow controller group 122 and the respective corresponding opening and closing valves of the valve group 123. The gas supply mechanism 120 is one example of the gas supply section.

The antenna 13 is disposed in the antenna chamber 103. The antenna 113 has an antenna wire 113a made of highly conductive metal such as copper or aluminum. The antenna wire 113a may be formed in any shape, such as annular or spiral. The antenna 113 is positioned at a distance from the top plate 102 by a spacer 117 made of an insulating member.

The antenna wire 113a has a terminal 118 connected to one end of a power-feeding member 116 that extends upward from the antenna chamber 103. The power-feeding member 116 has the other end connected to one end of a power-feeding line 119. The power-feeding line 119 has the other end connected to a high-frequency power supply 115 via a matching unit 114. The high-frequency power supply 115 supplies the antenna 113 with a high-frequency power having a frequency of, for example, 13.56 MHz via the matching unit 114, the power-feeding line 119, the power-feeding member 116, and the terminal 118. This high-frequency power generates an induced electric field in the space S1 within the processing chamber 104 below the antenna 113. The induced electric field converts the gas supplied from the gas supply pipe 124 into plasma, creating an inductively coupled plasma in the space S1. The antenna 113 is one example of a plasma generator.

A stage ST is provided on the bottom wall of the processing chamber 104 via a spacer 126 made of insulating materials. The substrate W is placed on the stage ST. The stage ST has a base 131 provided on the spacer 126, an electrostatic chuck 132 provided on the base 131, and a protective member 133 made of insulating materials. The protective member 133 is used to cover the side walls of the base 131 and the electrostatic chuck 132. The base 131 and the electrostatic chuck 132 are circular in shape to correspond to the shape of the substrate W, and the entire stage ST is cylindrical. The spacer 126 and the protective member 133 are made of insulating ceramics such as alumina.

The electrostatic chuck 132 is provided on the top surface of the base 131. The electrostatic chuck 132 has a dielectric layer 145 made of ceramic thermal spray coating and an electrode 146 embedded inside the dielectric layer 145. The electrode 146 may be in various forms, such as plate-like, film-like, grid-like, and net-like. The electrode 146 is connected to a direct current (DC) power supply 148 via a power-feeding line 147, and a DC voltage supplied from the DC power supply 148 is applied to the electrode 146. The DC voltage applied to the electrode 146 from the DC power supply 148 via the power-feeding line 147 is controlled by a switch (not illustrated) to turn it on and off. The DC voltage applied from the DC power supply 148 generates an electrostatic adsorption force such as Coulomb or Johnsen-Rahbek force in the electrode 146. This force results in the substrate W being held in place through adsorption on the upper surface of the electrostatic chuck 132. The dielectric layer 145 of the electrostatic chuck 132 may be made of materials such as aluminum oxide $(Al_2O_3)$ or yttrium oxide $(Y_2O_3)$.

The base 131 of the stage ST is provided with a temperature control mechanism and temperature sensor (both not illustrated), which control the temperature of the substrate W are provided. Additionally, the side wall 104a of the processing chamber 104 is also provided with a temperature control mechanism and temperature sensor (both not illustrated) used for controlling the temperature of the gas inside the processing chamber 104. Moreover, the processing container 101 is provided with a heat transfer gas supply mechanism (not illustrated) used for supplying a heat transfer gas between the substrate W and the stage ST, with the substrate W being placed on the stage ST. The heat transfer gas, such as He gas, is used to regulate the amount of heat transfer between the substrate W and the stage ST. Furthermore, the stage ST is provided with a plurality of elevating pins (not illustrated), which project and retreat to and from the upper surface of the electrostatic chuck 132, facilitating the transfer of the substrate W.

The processing chamber 104 is provided with a carrying in/out port 155 formed in the side wall 104a of the processing chamber 104. The carrying in/out port 155 is used for loading the substrate W into the processing chamber 104 and unloading the substrate W from the processing chamber 104. The carrying in/out port 155 may be opened and closed by a gate valve G. The gate valve G is controlled to open the carrying in/out port 155, enabling the substrate W to be loaded or unloaded through the carrying in/out port 155.

The processing chamber 104 is formed with an exhaust port 159 in its bottom wall. The exhaust port 159 is provided with an exhaust mechanism 160. The exhaust mechanism 160 has an auto pressure controller (APC) valve 162 and a vacuum pump 163, which creates a vacuum inside the processing chamber 104 by pumping out the gas via an exhaust pipe 161. The APC valve 162 adjusts the opening degree of the exhaust pipe 161 connected to the exhaust port 159 to control the pressure inside the processing chamber 104. The vacuum pump 163 is used to evacuate the inside of the processing chamber 104, and the inside of the processing chamber 104 is maintained at a predetermined degree of vacuum by adjusting the opening degree of the APC valve 162 during the plasma etching processing.

The controller 130 has memory such as read-only memory (ROM) and random-access memory (RAM) and a processor such as a central processing unit (CPU). The processor of the controller 130 reads out and executes a program stored in the memory of the controller 130 to control each component of the processing container 101.

[Film Structure]

Figure 4:
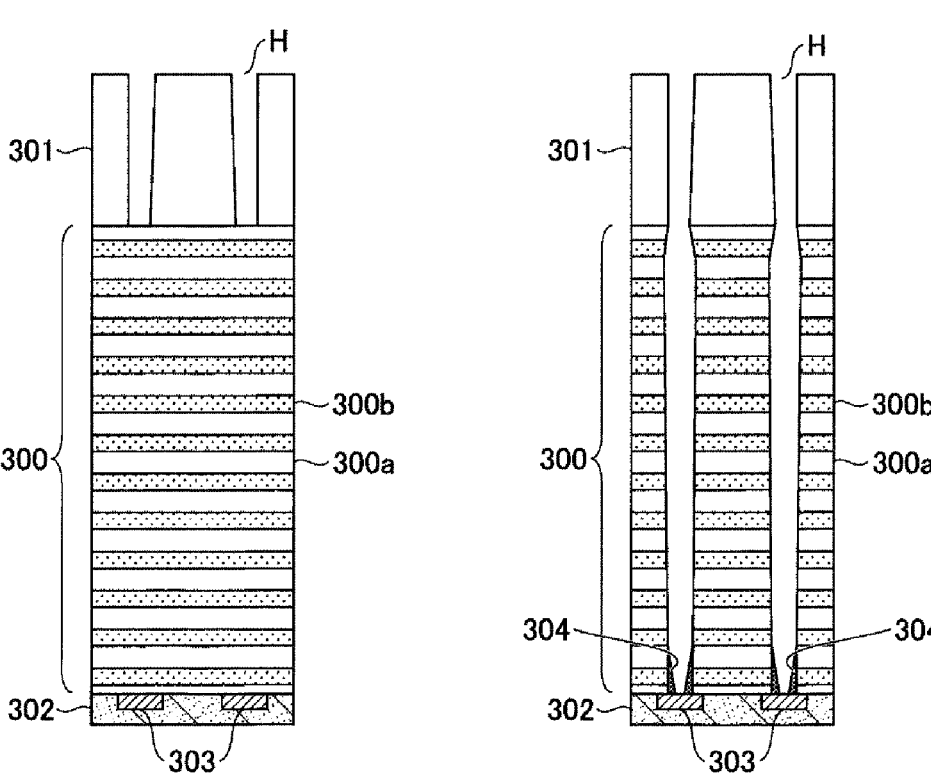
FIGS. 4A and 4B are diagrams illustrating an exemplary film structure formed on a substrate according to an embodiment.

The description is now given of a film structure formed on the substrate W according to an embodiment with reference to FIGS. 4A and 4B. FIGS. 4A and 4B are diagrams illustrating an exemplary film structure formed on the substrate W according to an embodiment. As illustrated FIG. 4A, the substrate W is provided with an etching target film 300 formed thereon. The etching target film 300 has alternately stacked layers of a silicon oxide $(SiO_2)$ layer 300a and a silicon nitride (SiN) layer 300b, as one example of the etching target film defined herein. A tungsten layer 303 is disposed under the etching target film 300, as one example of an underlying layer defined herein. A mask 301 is disposed on the etching target film 300. The film structure described above is just one example, and the substrate W may be formed with the stacked layer having at least the etching target film, the underlying layer disposed below the etching target film, and the mask disposed above the etching target film. The tungsten layer 303 may be a tungsten-containing film.

In some cases, the underlying layer may be a transition metal other than the tungsten layer 303. Furthermore, the present embodiment is not restricted to this particular example, and at least one of the mask 301 and the underlying layer may contain a transition metal. In the present embodiment, the tungsten layer 303 is disposed below a hole H formed in the mask 301, corresponding to the location of the hole H.

During the etching process, the transition metal is used as the underlying layer to etch the etching target film 300. In the present embodiment, the etching target film 300 is etched using the tungsten layer 303 as the underlying layer. Etching performed by controlling the substrate temperature to 0° C. or lower (hereinafter referred to as "low-temperature etching") causes a reaction product containing a transition metal to be produced. FIG. 4B illustrates an exemplary state in which the low-temperature etching has proceeded until the tungsten layer 303 is exposed. Referring to this figure, a tungsten-containing reaction product 304 is deposited on the tungsten layer 303 and on the sidewalls of the etching target film 300.

Even when a transition metal is used for the mask, the reaction product containing the transition metal is produced due to the low-temperature etching. The reaction product, which contains the transition metal such as tungsten and is deposited on at least one of the etching target film 300 or the mask 301 due to the low-temperature etching, is an example of a first reaction product defined herein. The first reaction product may be a halide of the transition metal. In one example, when the tungsten layer 303 is used as the underlying layer, a halide of tungsten may be the first reaction product.

The etching target film 300 is etched using a gas that contains a CF-based gas. Etching the etching target film 300 through the mask 301 using plasma of the CF-based gas forms the hole H or a slit-shaped groove in the etching target film 300. Etching the silicon oxide layer 300a and the silicon nitride layer 300b using plasma of the CF-based gas or CHF-based gas causes a reaction product of ammonium fluorosilicate (AFS) to be produced during the etching process and deposited on the etching target film 300. The reaction product of ammonium fluorosilicate is one example of the second reaction product that includes nitrogen (N), hydrogen (H), and halogen.

The second reaction product, which is deposited on the etching target film, may be an ammonium halide. The second reaction product may include at least one of ammonium, ammonium chloride, ammonium bromide, or ammonium iodide.

<Substrate Processing Method>

Figure 5:
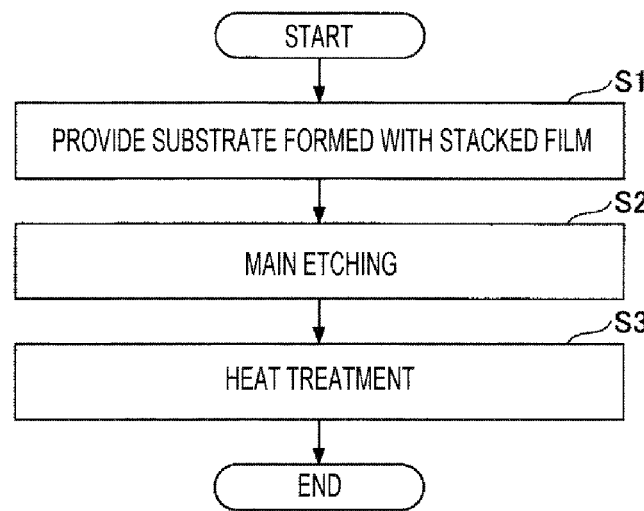
FIG. 5 is a flowchart illustrating an exemplary substrate processing method according to an embodiment.
Figure 6:
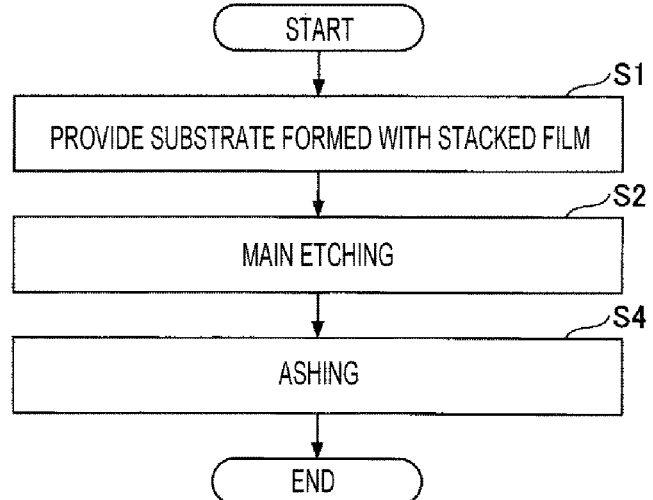
FIG. 6 is a flowchart illustrating another exemplary substrate processing method according to an embodiment.

An exemplary substrate processing method according to the present embodiment for processing the substrate W having the above-described film structure is described with reference to FIGS. 5 and 6. FIG. 5 is a flowchart illustrating an exemplary substrate processing method according to an embodiment. FIG. 6 is a flowchart illustrating another exemplary substrate processing method according to an embodiment.

The substrate processing method illustrated in FIG. 5 begins with providing the substrate W, which has a stacked film formed on it (step S1). This stacked film has at least the etching target film 300, the tungsten layer 303 disposed below the etching target film 300, and the mask 301 disposed above the etching target film 300. Subsequently, the etching target film 300 is etched through the mask 301 using, for example, radicals (step S2: main etching). After the etching, the substrate W is subjected to heat treatment while the temperature is controlled to a predetermined temperature (step S3), and then the processing is completed. The heat treatment is mainly aimed at removing the reaction product of ammonium fluorosilicate and involves radical ashing and baking.

Exposure of the substrate W to an atmosphere, with the reaction product of ammonium fluorosilicate being deposited, results in the reaction of the reaction products with moisture in the atmosphere. Over time, this exposure may cause a recess (side-etching) on the side surface of the silicon nitride layer 300b or a formation of swollen foreign substances due to a reaction with moisture on the side surface of the silicon nitride layer 300b. This may cause damage to the stacked film or clogging of the hole H, which adversely affects the subsequent process, leading to a decrease in yield. Moreover, to minimize this decrease in yield, it is necessary to shorten the duration of exposure of the substrate W to the atmosphere during a period from the completion of the etching process to the subsequent substrate processing step.

Accordingly, it is crucial to remove the ammonium fluorosilicate before exposing the substrate W to the atmosphere. Removing the ammonium fluorosilicate may employ wet cleaning using pure water or a chemical solution, but the wet cleaning requires exposure of the substrate W to the atmosphere. Specifically, in some cases, wet cleaning may cause the formation of side etching or swollen foreign substance on the substrate, leading to damage to the silicon nitride layer 300b. Additionally, adding an extra wet cleaning process is likely to decrease the throughput.

On the other hand, the substrate processing system 1 according to the present embodiment is capable of subjecting the substrate W to heat treatment after the etching process without being exposed to the atmosphere. This results in enabling the removal of ammonium fluorosilicate, so preventing any damage to the stacked film.

The substrate processing method illustrated in FIG. 6 begins with providing the substrate W that has a stacked film formed on it (step S1), similar to step S1 of FIG. 5. Then, the etching target film 300 is etched using plasma through the mask 301 (step S2). After the etching, the substrate W is subjected to ashing while the temperature is controlled to a predetermined temperature (step S4), and then the processing is completed. During the ashing process, the mask 301 is removed, and any reaction product that includes ammonium fluorosilicate or CF polymer may also be eliminated. The ashing processing in step S4 is also included in one example of the heat treatment. The reaction product that includes CF polymer is an example of the third reaction product that contains carbon (C) and fluorine (F). The third reaction product is produced during the etching process and deposited on the etching target film 300.

The etching process and the heat treatment process (ashing process) are performed without exposing the substrate W to the atmosphere. Specifically, the processing of steps S2 and S3 in FIG. 5 and the processing of steps S2 and S4 in FIG. 6 may be performed in the same processing chamber or different processing chambers among the processing chambers 211 to 214 of the substrate processing system 1 in which the substrate W is not exposed to the atmosphere.

Setting conditions for the respective processes are given below.

<Etching Process>

Gas conditions: $H_2/C_4F_8$ gas

Processing chamber pressure: 30 mTorr (4.0 Pa)

Wafer temperature during processing: 0° C. (substrate temperature)

First high frequency (power): 40 MHz to 100 MHz, 3 kW, continuous wave

Second high frequency (power): 400 kHz to 3 MHz, 6 kW, continuous wave

<Heat Treatment Process: Baking>

Gas conditions: $O_2/N_2$ gas or $N_2$ gas

Processing chamber pressure: 1.3 Torr (173 Pa)

13

Wafer temperature during processing: 250° C. (stage temperature)

<Heat Treatment Process: Radical Ashing Process>
Gas conditions: $O_2/N_2$ gas
Processing chamber pressure: 1.3 Torr
Wafer temperature during processing: 50° C. to 300° C. (stage temperature)
Plasma source: ICP <Heat Treatment Process: Plasma Ashing Process>
Gas conditions: $O_2$ gas
Processing chamber pressure: 400 mTorr (53.3 Pa)
Wafer temperature during processing: −30° C. to 50° C. (stage temperature)
First high frequency (power): 40 MHz to 100 MHz, 1.5 kW, continuous wave <Low-Temperature Etching>

Figure 7A:
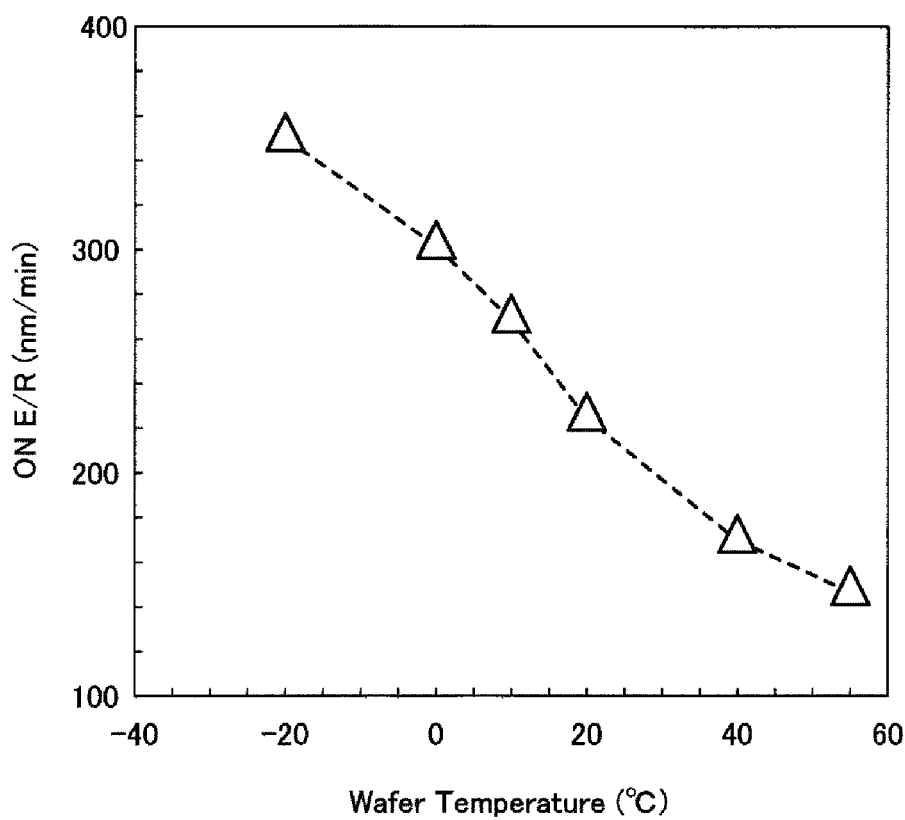
FIG. 7A is a diagram illustrating an example of an etching rate as a function of a substrate temperature according to an embodiment.
Figure 7B:
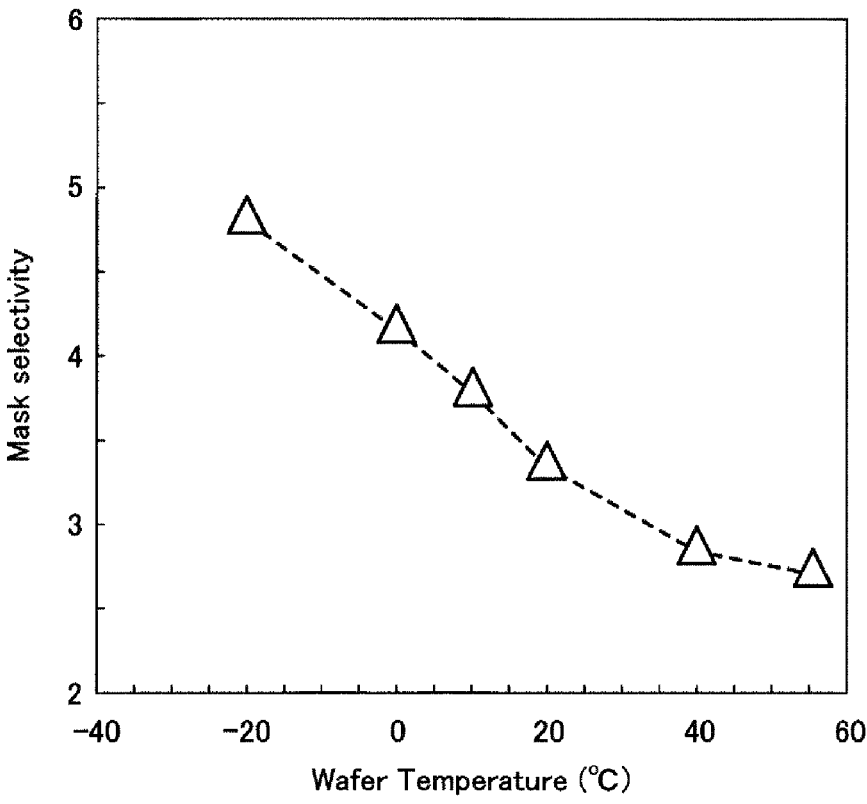
FIG. 7B is a diagram illustrating an example of a mask selection ratio as a function of a substrate temperature according to an embodiment.

The characteristics of low-temperature etching are described below with reference to FIGS. 7A and 7B. Specifically, FIG. 7A is a diagram illustrating an example of etching rate as a function of a substrate temperature according to an embodiment, while FIG. 7B is a diagram illustrating an example of mask selectivity as a function of a substrate temperature according to an embodiment. FIG. 7A illustrates the etching rate of the etching target film 300 (stacked film of the silicon oxide layer 300a and the silicon nitride layer 300b) represented in the vertical axis as a function of the substrate temperature represented in the horizontal axis. FIG. 7B illustrates the mask selectivity for the etching target film 300 illustrated in the vertical axis as a function of the substrate temperature represented in the horizontal axis. The mask selectivity is the ratio of the etching rate of the etching target film 300 to the etching rate of the mask 301.

As illustrated in FIGS. 7A and 7B, controlling the substrate temperature to a low-temperature range (e.g., 0° C. or below) through low-temperature etching is capable of improving the etching rate and mask selectivity of the etching target film 300. The etching rates of the silicon oxide layer 300a and the silicon nitride layer 300b increase.

However, in low-temperature etching, the substrate temperature is controlled to a low temperature of 0° C. or below, which results in a significant temperature difference during the subsequent heat treatment process (ashing process) compared to that during the etching process. Thus, heating the inside of the processing chamber to a high temperature takes time, which leads to a decrease in throughput.

Further, in the etching process, the transport of radicals causes challenges in a case where a silicon layer 302 is used for the underlying layer of the etching target film 300 (see FIG. 4A). In one example, in the case where the underlying layer is the silicon layer 302 under the setting conditions described above (processing chamber pressure=30 mT (4.0 Pa), substrate temperature ≤0° C.), the Si—F gas generated during etching vaporizes. This results in a failure to supply a CF-based precursor to the bottom of the hole H, which in turn prevents the deposition of a protective film containing C on the bottom of the hole H. Moreover, scraping away the silicon layer 302 results in a lack of ensuring underlayer selectivity. The underlayer selectivity is the ratio of the etching rate of the etching target film 300 to the etching rate of the underlying layer (e.g., the silicon layer 302).

An approach is sometimes utilized to ensure the underlayer selectivity, which involves performing an over-etching process after the main etching process of step S2 in FIG. 5 or 6. This approach involves raising the substrate temperature to allow carbon radicals to reach the bottom of the hole H. However, during the over-etching process, the substrate temperature is controlled to 0° C. or higher, which results in a lower etching rate than that achieved by low-temperature etching, leading to a reduction in throughput and productivity.

To address this issue, the film structure according to the present embodiment includes the tungsten layer 303 disposed as an underlying layer below the hole H formed in the mask 301, as illustrated in FIG. 4A. Accordingly, performing the low-temperature etching during the etching process allows the etching target layer 300 to be etched at a high etching rate. In the case where the underlying layer is exposed at the bottom of the hole H in the etching target film 300, the tungsten layer 303 is exposed rather than the silicon layer 302, as illustrated in FIG. 4B, which enables the prevention of the silicon layer 302 from being scraped away in the bottom of the hole H.

Figure 8:
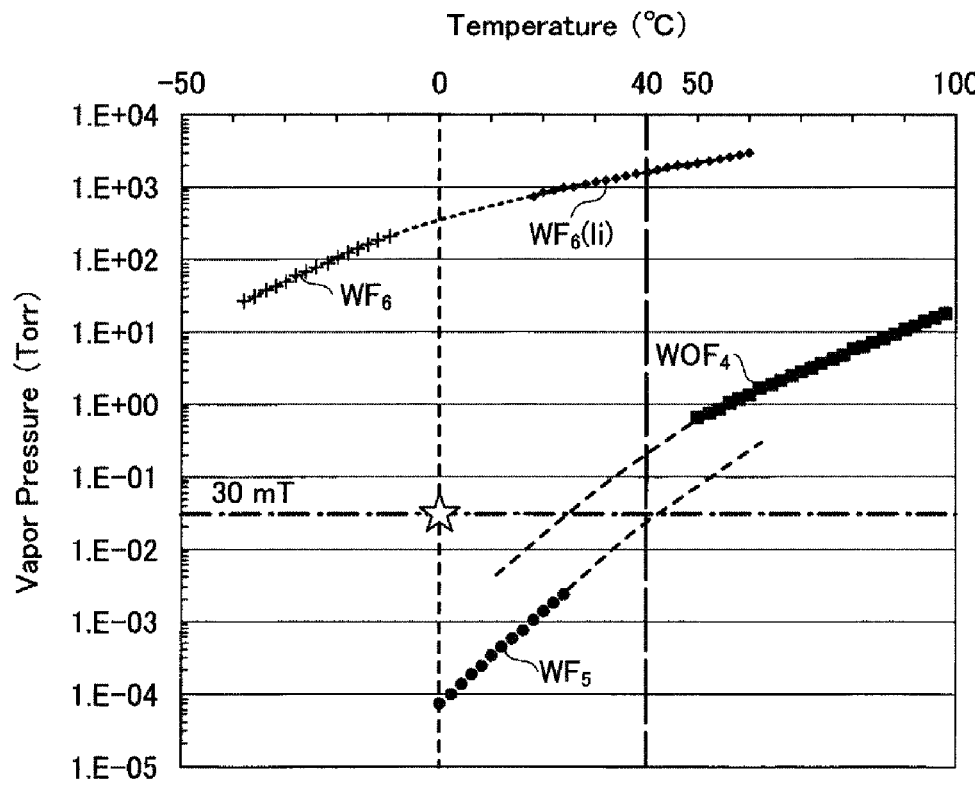
FIG. 8 is a diagram illustrating a vapor pressure curve of a tungsten-containing gas as a function of temperature.

When the tungsten layer 303 is exposed at the bottom of the hole H in the etching target film 300, the tungsten layer 303 is scraped away. FIG. 8 is a diagram illustrating vapor pressure curves for tungsten pentafluoride ($WF_5$), tungsten hexafluoride ($WF_6$), and tungsten oxytetrafluoride ($WOF_4$) as a function of temperature.

As depicted in the vapor pressure curves, the gases of $WF_5$, $WF_6$, and $WOF_4$ do not evaporate at vapor pressures lower than the respective vapor pressures defined by the curves of $WF_5$, $WF_6$, and $WOF_4$ at temperatures of, for example, 40° C. or below. In this way, using a material containing tungsten or similar metal with a high underlayer selectivity as the underlying layer makes it difficult to evaporate the tungsten-containing reaction product 304 (see FIG. 4B) even without the supply of carbon radicals to the bottom of the hole H. Thus, this tungsten-containing reaction product 304 enables the ensuring of underlayer selectivity.

One example of the setting conditions described above (processing chamber pressure=30 mT (4.0 Pa), substrate temperature ≤40° C.) is that $WF_5$ and $WOF_4$ do not vaporize and are deposited on the tungsten-containing layer, such as the tungsten layer 303. In the example of FIG. 4B, the tungsten-containing reaction product 304 is deposited on the upper portion of the tungsten layer 303 and on the sidewalls of the etching target film 300.

Figures 9A, 9B:
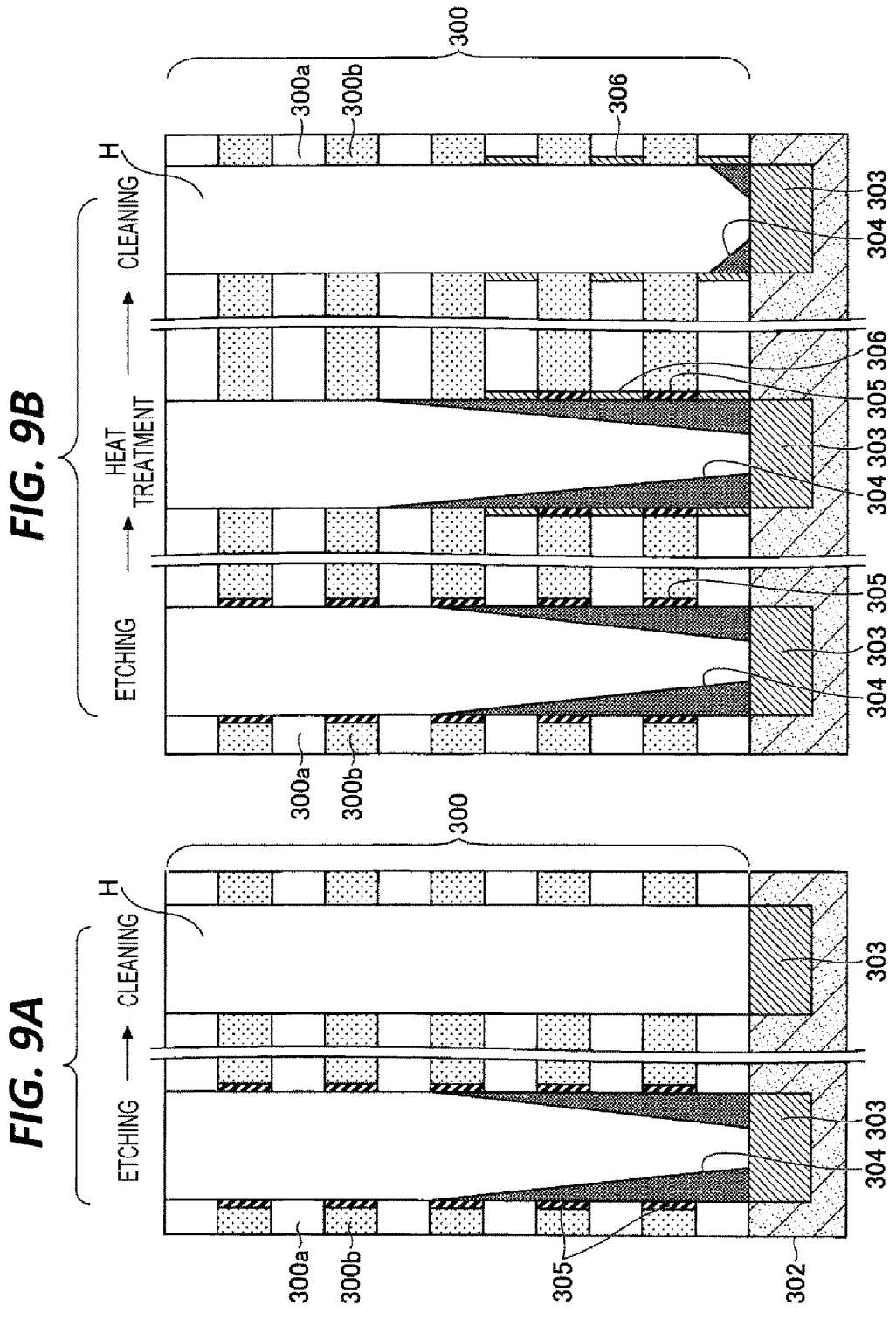
FIGS. 9A and 9B are diagrams illustrating an example of the occurrence of tungsten residue according to an embodiment.

In the state described above, heat treatment (involving radical ashing and plasma ashing) was performed. In FIG. 9B, after performing low-temperature etching followed by heat treatment, cleaning with hydrofluoric acid was performed. In this case, a tungsten-containing oxide film 306 subjected to oxidization of a tungsten-containing reaction product was produced on the side wall or similar portions of the etching target film 300. It was found that the tungsten-containing oxide film 306 was converted into a substance that was resistant to removal by hydrofluoric acid cleaning by performing heat treatment before hydrofluoric acid cleaning.

Meanwhile, FIG. 9A depicts the results of performing hydrofluoric acid cleaning (HF cleaning) without performing heat treatment after low-temperature etching. In this case, the tungsten-containing reaction product 304 does not exist on the side wall or other similar portions of the etching target film 300. In both cases, the hydrofluoric acid cleaning was performed after exposing the substrate W to the atmosphere.

As can be seen from this, the tungsten-containing reaction product 304 underwent a heat treatment process and transformed into a stable tungsten-containing oxide film 306 ($WO_x$), and became a film resistant to removal even by hydrofluoric acid cleaning. A reaction product 305 of ammonium fluorosilicate produced during the etching process was removed by hydrofluoric acid cleaning.

Further, as illustrated in FIG. 9B, after performing the hydrofluoric acid cleaning, it was observed that the tungsten-containing oxide film 306 remained on the sidewalls of the silicon oxide layer 300a, but not on the sidewalls of the silicon nitride layer 300b.

The reason why the tungsten-containing oxide film 306 does not remain on the sidewalls of the silicon nitride layer 300b is that the tungsten oxide film on the silicon nitride layer 300b adheres to the ammonium fluorosilicate formed on the silicon nitride layer 300b. Thus, during the hydrofluoric acid cleaning, it may be considered that the peeling off of the ammonium fluorosilicate by hydrofluoric acid resulted in the removal of the tungsten-containing oxide film 306 as well. Further, no use of oxygen gas for the heat treatment failed to oxidization of the tungsten-containing reaction product 304 adhering to the silicon nitride layer 300b. Thus, no use of oxygen gas for the heat treatment prevents the formation of the tungsten-containing oxide film 306 on the silicon nitride layer 300b.

On the other hand, the adhering of the tungsten-containing oxide film 306 to the side wall of the silicon oxide layer 300a is considered to be attributed to the reaction between the silicon oxide layer 300a and the tungsten-containing reaction product 304 during the heat treatment.

There are two possible sources of oxygen for the oxidization of the tungsten-containing reaction product 304 to form the tungsten-containing oxide film 306. The first source is the silicon oxide layer 300a, and the second source is oxygen gas. Specifically, the etching target film 300 includes a silicon and oxygen-containing film, such as the silicon oxide layer 300a, which means that the oxygen (O) responsible for oxidizing the tungsten-containing reaction product may be supplied from the silicon and oxygen-containing film where the tungsten-containing oxide film 306 is deposited. Additionally, introducing the oxygen-containing gas into the processing container allows the oxygen (O) for oxidizing the tungsten-containing reaction product to be supplied from the oxygen-containing gas.

Figure 10:
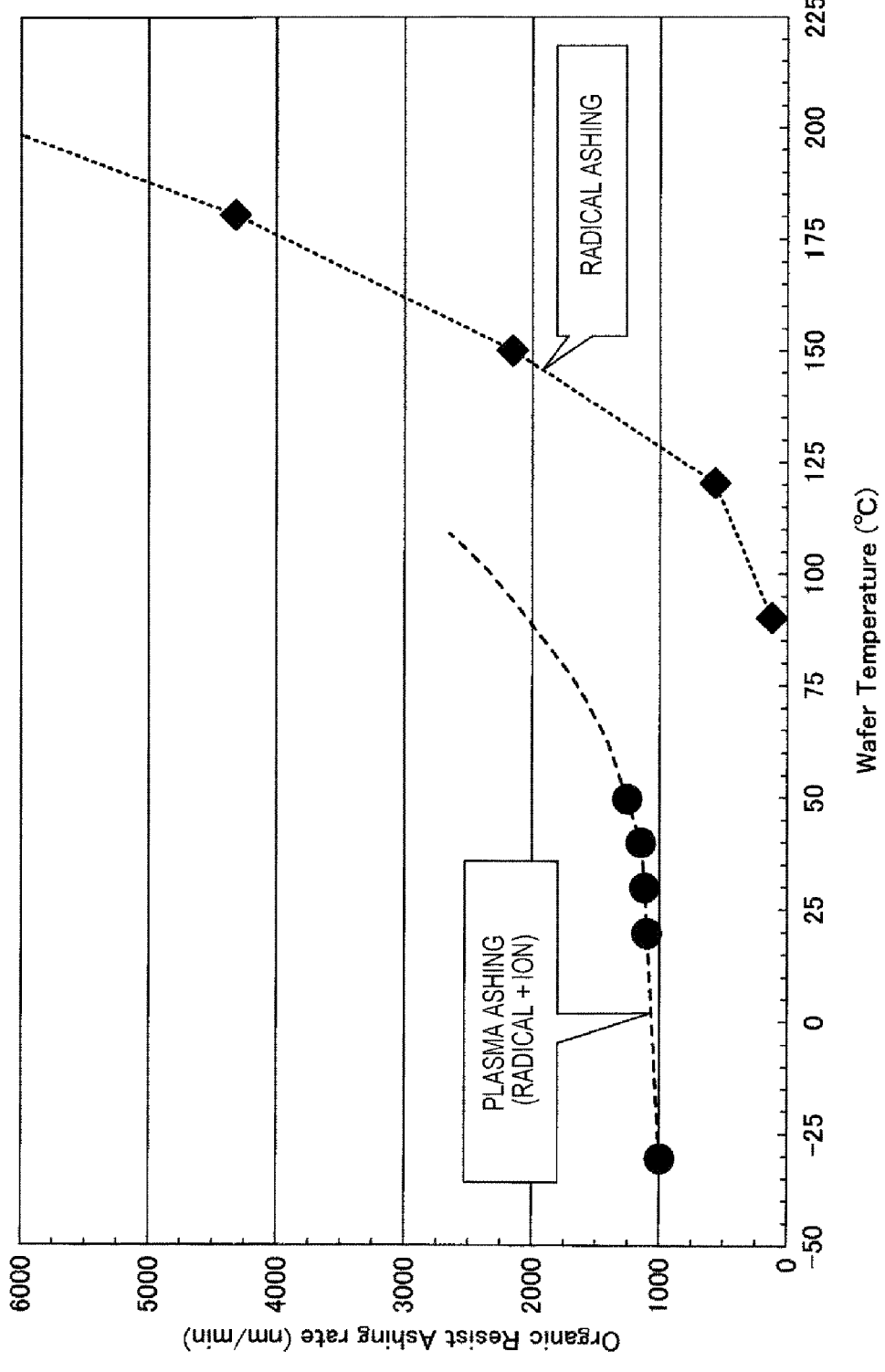
FIG. 10 is a diagram illustrating the relationship between an ashing rate of an organic resist coating film and a substrate temperature according to an embodiment.

The above-described substrate processing and substrate temperature control for removing the tungsten-containing reaction product 304 without forming the tungsten-containing oxide film 306 from the tungsten-containing reaction product 304, which is generated during low-temperature etching, are described with reference to FIGS. 10 and 11. FIG. 10 is a diagram illustrating the relationship between the temperature of the substrate W and the ashing rate upon subjecting an organic resist coating film to ashing processing as a substitute for the mask 301 made of an organic film according to an embodiment. FIG. 11 is a table illustrating the presence or absence of residues on the substrate W after performing heat treatment on the substrate W according to an embodiment.

FIG. 10 illustrates the ashing rate as a function of the substrate temperature in the case of performing the radical ashing process or the plasma ashing process after the etching process on the basis of the setting conditions of the etching process, the setting conditions of the radical ashing process, and the setting conditions of the plasma ashing process described above. It may be observed that the substrate temperature control is different between the radical ashing process and the plasma ashing process.

For the radical ashing process, the ion energy is not used, so at elevated temperatures, the oxygen reacts with the organic film mask (organic resist coating film) and vaporizes due to the high thermal energy. Thus, the ashing rate is strongly influenced by temperature, with higher temperature resulting in an increased ashing rate.

On the other hand, as the temperature decreases, the ashing rate also decreases, and at approximately 90° C., the ashing rate tends to approach zero. This is why the organic film mask is not completely removed at substrate temperatures lower than approximately 90° C. Thus, the substrate temperature in the radical ashing is controlled to a temperature higher than approximately 90° C. at which the organic film mask may be completely removed.

FIG. 11 illustrates the presence or absence of tungsten-containing substance residues, ammonium fluorosilicate residues, and CF polymer residues on the substrate W, as a function of the wafer's temperature (substrate temperature) of the substrate W. The data was obtained after performing either the radical ashing process or the plasma ashing process on the substrate W, following the etching process, on the basis of the setting conditions of the etching process, the setting conditions of the radical ashing process, and the setting conditions of the plasma ashing process described above.

Upon performing the radical ashing process, when the wafer's temperature is higher than 115° C., residues of tungsten-containing substances (W residues) are observed on the substrate W. This indicates that a stable tungsten oxide film may be produced at approximately 115° C. or higher. Thus, the substrate temperature during radical ashing is controlled below approximately 115° C. Consequently, to ensure the complete removal of the organic film mask while preventing the formation of a tungsten oxide film in the radical ashing process, it is preferable to control the substrate temperature within the range of approximately 90° C. to approximately 115° C.

In other words, the first reaction product, which includes a transition metal exemplified by tungsten, is produced in the etching process. When a temperature with a value equal to or less than the temperature at which the first reaction product reacts with oxygen (O) to form a metal oxide exemplified by a tungsten oxide film is set as a first temperature, the predetermined temperature of the substrate W (substrate temperature) during heat treatment is set to a value lower than the first temperature. An example of the first temperature is a temperature of approximately 115° C., at which a stable tungsten oxide film is produced. In addition, it is preferable to set the first temperature lower than the temperature at which the etching target film 300 undergoes deformation or alteration by thermal.

Upon performing the plasma ashing process, the ashing is performed with the energy of ions in addition to radicals, ensuring an adequate ashing rate even at a substrate temperature lower than that during radical ashing. However, at a wafer temperature below 60° C., residues attributed due to ammonium fluorosilicate (AFS) may be observed. The decomposition temperature of ammonium fluorosilicate (AFS) is approximately 60° C. Thus, in the plasma ashing process, it is preferable to control the substrate temperature within the range of approximately 60° C. to approximately 115° C. to ensure the removal of ammonium fluorosilicate without forming a tungsten oxide film.

Specifically, the second reaction product that includes silicon (Si), nitrogen (N), and fluorine (F), exemplified by ammonium fluorosilicate, is produced in the etching process. When a temperature with a value equal to or greater than the temperature at which the second reaction product undergoes thermal decomposition is assumed as a second temperature, the predetermined temperature of the substrate W (substrate temperature) may be set to be equal to or higher than the second temperature to remove the second reaction product in the heat treatment process. An example of the second temperature is approximately 60° C., which is the temperature at which ammonium fluorosilicate (AFS) decomposes. The second reaction product deposited on the etching target film includes ammonium fluorosilicate.

In the case of performing the radical ashing process, when the wafer's temperature is lower than 90° C., CF polymer residues are observed. In the plasma ashing process, there is no correlation between wafer temperature and the presence of a CF polymer residue, so no CF polymer residue is observed. This is consistent with the trend of the ashing rate. In other words, the CF polymer may be removed by setting the temperature at which the organic film mask may be removed. However, the temperature at which the CF polymer may be removed in the ashing process may also be influenced by variations in the process conditions of the etching process, so the temperature at which the CF polymer may be removed is not limited to matching the temperature at which the organic film mask may be removed.

As described above, the substrate temperature is intended to be controlled as high as possible during the ashing process to achieve a high ashing rate. However, once a tungsten oxide film is formed, it becomes challenging to remove the tungsten oxide film, even with hydrofluoric acid cleaning. Therefore, it is necessary to control the upper temperature of the substrate W to approximately 115° C.

Furthermore, in low-temperature etching, ammonium fluorosilicate tends to remain, so it is preferable to control the substrate temperature to a lower limit of approximately 60° C. during plasma ashing to ensure the complete removal of the ammonium fluorosilicate.

Moreover, in radical ashing, it is recommended to control the lower limit of the temperature of the substrate W to approximately 90° C. during radical ashing to ensure the complete removal of the organic film mask.

Modification when a temperature with a value equal to or greater than the temperature at which the second reaction product containing nitrogen (N), hydrogen (H), and halogen produced and deposited on the etching target film 300 in the etching process undergoes thermal decomposition is assumed as the second temperature, the temperature of the substrate W during the heat treatment process may be set to be equal to or higher than the second temperature. This ensures that the second reaction product may be removed.

Furthermore, it may be considered that the temperature at which the CF polymer, a reaction product produced in the etching process, may be removed is approximately 90° C., which is the same as the temperature for removing the mask. Therefore, controlling the substrate temperature to approximately 90° C. or higher enables the removal of the third reaction product that contains carbon (C) and fluorine (F), exemplified by CF polymer. However, when variations in the process conditions of the etching process affect the temperature at which the CF polymer may be removed in the ashing process, so it is preferable to set the substrate temperature to a temperature at which the CF polymer may be removed.

In other words, when a temperature with a value equal to or greater than the temperature at which the third reaction product, such as the CF polymer, may be removed in the ashing process is assumed as a third temperature, the substrate temperature may be set to be equal to or higher than the third temperature to remove the third reaction product in the ashing process.

When the mask of an organic film is used, the organic film may be removed in the ashing process. The third temperature may be set to a temperature with a value equal to or greater than the temperature at which the organic film may be removed in the ashing process.

In the etching process, the substrate temperature may be set to a temperature with a value below the temperature indicated by the vapor pressure curve of the transition metal halide.

Furthermore, setting the substrate temperature depending on the radical ashing or plasma ashing illustrated in FIG. 10 may achieve a similar effect not only in the case of using tungsten for the underlying layer but also in the case of using tungsten for the mask.

In the etching process, the etching target film 300 containing silicon (Si) may be etched using plasma generated from a gas mixture containing nitrogen (N), hydrogen (H), and fluorine (F).

In the etching process, the etching target film 300 containing silicon nitride (SiN) may be etched using plasma generated from a gas mixture containing hydrogen (H) and fluorine (F).

The etching and heat treatment processes are performed without exposure of the substrate W to the atmosphere. The ammonium fluorosilicate is removed during the heat treatment process, after which the substrate W may be exposed to the atmosphere. Specifically, the substrate W may be exposed to the atmosphere, during the ashing process and hydrofluoric acid cleaning performed after the heat treatment process.

When separate substrate processing apparatuses are used for radical ashing and plasma ashing processes, in the substrate processing apparatus for performing the radical ashing process, the lower limit is not critical as long as the upper limit of the temperature of the substrate W is controlled to approximately 115° C. This enables the removal of the tungsten-containing reaction product without forming a tungsten-containing oxide film. Further, in the substrate processing apparatus that performs the plasma ashing process, ammonium fluorosilicate is not left behind, so the upper limit of the temperature of the substrate W is not critical as long as the lower limit is controlled to approximately 60° C.

When both the radical ashing and plasma ashing processes are performed in the same substrate processing apparatus, the substrate temperature is controlled within the range of approximately 60° C. to approximately 115° C.

The mask 301 on the etching target film 300 may be removed by performing oxygen radical ashing or oxygen plasma ashing on the etched shapes such as the hole H formed in the main etching process. The critical dimensions (CDs) of the widest position of the hole H (Bow CD) and the bottom of the hole H (BTM CD) measured after the removal of the mask 301 showed almost no change before and after the ashing. Therefore, performing oxygen radical ashing or oxygen plasma ashing does not affect the etched shape.

In the substrate processing system 1, both the etching process and heat treatment may be performed not only in the same system (In-system) but also in the same processing chamber (In-situ). The processing chamber that performs the heat treatment has a heater mounted on the stage to raise the stage temperature to a high level, enabling performing heat treatment on the substrate. The heat treatment may be performed in at least one of a processing chamber or a load lock chamber provided with a stage having a heater. The heat treatment may also be performed in a vacuum transfer chamber 220 where a heater is mounted on the arm of the transfer mechanism 221 that holds the substrate. Alternatively, the substrate W may be subjected to heat treatment through radiant heating from a lamp or other similar devices, infrared heating, or other similar heating methods.

As described above, the substrate processing method and the substrate processing apparatus according to the present embodiment enable the removal of reaction products containing transition metals that get deposited during the etching process.

The substrate processing apparatus according to an embodiment of the present disclosure may be applied to any type of apparatus, including an atomic layer deposition (ALD), capacitively coupled plasma (CCP), inductively coupled plasma (ICP), radial line slot antenna (RLSA), electron cyclotron resonance (ECR) plasma, or helicon wave plasma (HWP).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   providing a substrate formed with a stacked film including at least an etching target film, an underlying layer disposed below the etching target film, and a mask disposed above the etching target film,
   wherein the etching target film includes alternately stacked layers of a silicon oxide layer and a silicon nitride layer,
   wherein the underlying layer includes a silicon layer and a transition metal layer disposed in the silicon layer;
   etching the etching target film through the mask using plasma to expose the transition metal layer and to produce a first reaction product on the silicon nitride layers and a second reaction product on at least a portion of the first reaction product and on at least one of the silicon oxide layers, and
   wherein the first reaction product and the second reaction product are different from one another; and
   performing heat treatment on the substrate at a predetermined temperature after the etching, wherein the mask contains a transition metal.

2. The substrate processing method according to claim 1, wherein the first reaction product containing the transition metal is produced in the etching and deposited on at least one of the etching target film and the mask, and when a value equal to or less than a temperature at which the first reaction product reacts with oxygen (O) to form a metal oxide is assumed as a first temperature, the predetermined temperature of the substrate in the performing of the heat treatment is set to be lower than the first temperature.

3. The substrate processing method according to claim 2, wherein the etching target film has a silicon and oxygen-containing film, and the oxygen (O) is supplied from the silicon and oxygen-containing film of the etching target film on which the first reaction product is deposited.

4. The substrate processing method according to claim 2, further comprising: supplying an oxygen-containing gas into a processing container in which the substrate is provided, wherein the oxygen (O) is supplied from the oxygen-containing gas.

5. The substrate processing method according to claim 2, wherein the first temperature is a value lower than a temperature at which the etching target film undergoes deformation or alteration by thermal.

6. The substrate processing method according to claim 1, wherein the second reaction product containing silicon (Si), nitrogen (N), and fluorine (F) is produced in the etching and deposited on the etching target film, and when a value equal to or greater than a temperature at which the second reaction product undergoes thermal decomposition is assumed as a second temperature, the predetermined temperature of the substrate in the performing of the heat treatment is set to be equal to or higher than the second temperature to remove the second reaction product.

7. The substrate processing method according to claim 6, wherein the second reaction product deposited on the etching target film includes ammonium fluorosilicate.

8. The substrate processing method according to claim 1, wherein, in the etching, when the etching target film contains silicon (Si), the etching target film is etched using plasma generated from a gas containing nitrogen (N), hydrogen (H), and fluorine (F).

9. The substrate processing method according to claim 1, wherein, in the etching, when the etching target film contains silicon nitride (SiN), the etching target film is etched using plasma generated from a gas containing hydrogen (H) and fluorine (F).

10. The substrate processing method according to claim 1, wherein the second reaction product containing nitrogen (N), hydrogen (H), and halogen is produced in the etching and deposited on the etching target film, and when a value equal to or greater than a temperature at which the second reaction product undergoes thermal decomposition is assumed as a second temperature, the predetermined temperature of the substrate in the performing of the heat treatment is set to be equal to or higher than the second temperature to remove the second reaction product.

11. The substrate processing method according to claim 10, wherein the second reaction product deposited on the etching target film is an ammonium halide.

12. The substrate processing method according to claim 10, wherein the second reaction product deposited on the etching target film includes at least one of ammonium, ammonium chloride, ammonium bromide, and ammonium iodide generated in the etching.

13. The substrate processing method according to claim 1, wherein the performing of the heat treatment includes ashing the substrate using plasma.

14. The substrate processing method according to claim 13, wherein, when the mask is the organic film, the ashing removes the organic film.

15. The substrate processing method according to claim 13, wherein the ashing removes a third reaction product containing carbon (C) and fluorine (F) produced in the etching.

16. The substrate processing method according to claim 15, wherein, when a value equal to or greater than a temperature at which the third reaction product is removable in the ashing is assumed as a third temperature, the ashing removes the third reaction product by setting the predetermined temperature of the substrate to be equal to or higher than the third temperature.

17. The substrate processing method according to claim 16, wherein the third temperature is a value equal to or greater than a temperature at which an organic film is removable in the ashing.

18. The substrate processing method according to claim 1, wherein the etching and the performing of the heat treatment are carried out without exposing the substrate to an atmosphere.

19. The substrate processing method according to claim 1, wherein, in the etching, the predetermined temperature of the substrate is set to a value lower than a temperature indicated by a vapor pressure curve of a halide of the transition metal.

20. The substrate processing method according to claim 1, wherein the transition metal is tungsten (W).

* * * * *